United States Patent [19]
Taniguchi et al.

[11] Patent Number: 6,043,650

[45] Date of Patent: Mar. 28, 2000

[54] INSPECTING APPARATUS USING MAGNETIC RESONANCE

[75] Inventors: Yo Taniguchi, Hachioji; Kenichi Okajima, Mitaka; Shinji Kawasaki, Matsudo, all of Japan

[73] Assignee: Hitachi, Ltd., Tokyo, Japan

[21] Appl. No.: 09/010,596

[22] Filed: Jan. 22, 1998

[30] Foreign Application Priority Data

Jan. 22, 1997 [JP] Japan .................................. 9-023215

[51] Int. Cl.$^7$ .................................................. G01V 3/00
[52] U.S. Cl. ........................ 324/306; 324/309; 324/318; 600/410
[58] Field of Search ..................... 324/309, 311, 324/318, 307, 306; 600/415, 410, 519

[56] References Cited

U.S. PATENT DOCUMENTS

| | | | |
|---|---|---|---|
| 5,038,785 | 8/1991 | Blakeley et al. | 128/653 |
| 5,154,178 | 10/1992 | Shah | 128/653.2 |
| 5,251,628 | 10/1993 | Foo | 128/653.2 |
| 5,348,011 | 9/1994 | NessAiver | 128/653.2 |

OTHER PUBLICATIONS

"Retrospective Cardiac Gating: A Review of Technical Aspects and Future Directions", By Gerald Lenz, et al Magnetic Resonance Imaging. vol. 7.pp. 445–455, 1989.

*Primary Examiner*—Christine K. Oda
*Assistant Examiner*—Brij B. Shrivastav
*Attorney, Agent, or Firm*—Antonell, Terry, Stout & Kruas, LLP

[57] ABSTRACT

There are provided body movement measuring means for measuring the movement of an object of inspection and control means for controlling at least means for applying a gradient magnetic field and means for applying a high frequency magnetic field. The control means performs a sequence for measuring an echo by applying a phase-encoding gradient magnetic field quantity a plurality of times with the same phase-encoding gradient magnetic field quantity and repeatedly executes the sequence while varying the phase-encoding gradient magnetic field quantity. When the phase-encoding gradient magnetic field quantity is small, the number of execution times of the sequence executed with the same phase-encoding gradient magnetic field quantity in a case where the phase-encoding gradient magnetic field quantity is small is set to be larger than a case where the phase encoding gradient magnetic field quantity is large to reduce the probability of omission occurrence of echo measurement in the small phase-encoding magnetic field which exerts a large influence on an image, thereby suppressing the occurrence of an artifact.

12 Claims, 9 Drawing Sheets

PHASE-ENCODING QUANTITY p

PHASE-ENCODING QUANTITY p

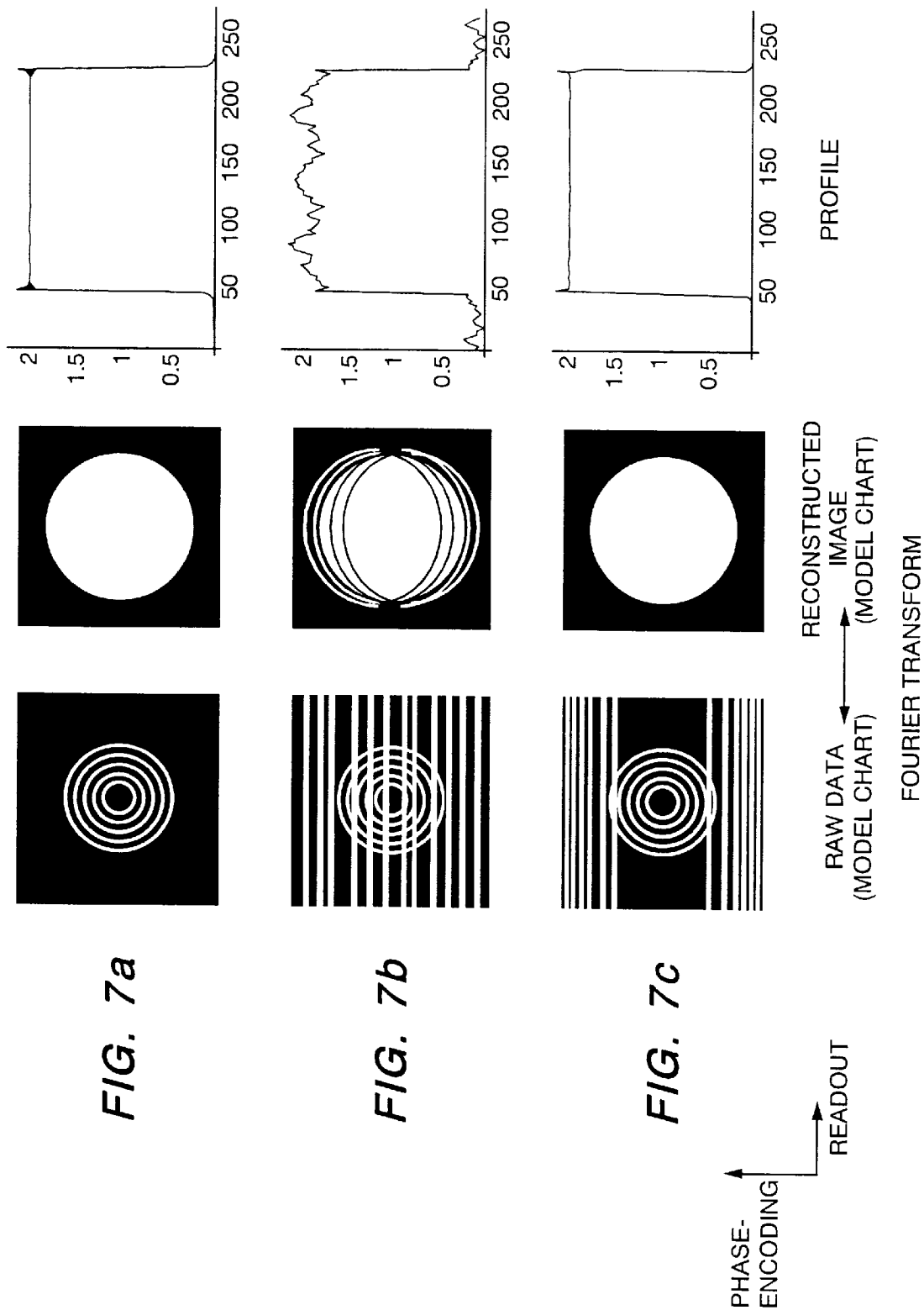

FIG. 8
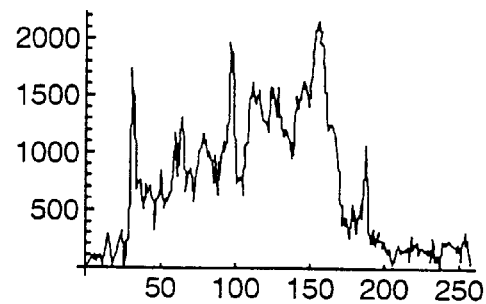
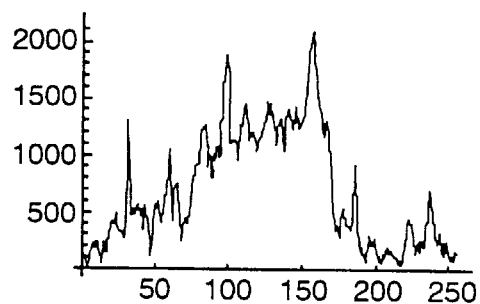
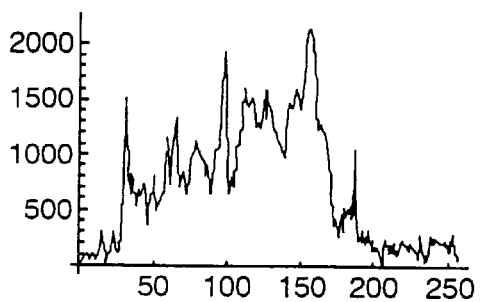
PHASE-
ENCODING
READOUT

INSPECTING APPARATUS USING MAGNETIC RESONANCE

BACKGROUND OF THE INVENTION

The present invention relates to an inspection apparatus using magnetic resonance, and more particularly, to an apparatus for acquiring images of an object having periodic movement such as heartbeat, respiration.

A magnetic resonance imaging (MRI) apparatus is a medical image diagnostic apparatus for magnetically resonating water components in an arbitrary plane which traversing an object of inspection and acquiring a slice image of the plane from generated magnetic resonance signals. Generally, when a slice gradient magnetic field for specifying a plane to obtain a slice image is applied and simultaneously an excitation pulse for exciting magnetization in the plane is applied, magnetic resonance signals (echoes) generated at a stage when phases of excited magnetization are coincided are obtained. In order to give position information to the echo, a phase-encoding gradient magnetic field and a readout gradient magnetic field are applied in a period from the excitation to the acquisition of echoes. The measured echo is called "raw data" and stored in a memory called a k-space having the axis of abscissa in the readout direction and the axis of ordinate in the phase-encoding gradient magnetic field direction. The raw data is subjected to inverse Fourier transformation, thereby reconstructing an image.

The pulses and the gradient magnetic fields for generating the echoes are applied on the basis of a preset pulse sequence. Various pulse sequences are known according to purposes. For example, in a gradient echo imaging as a general imaging, the pulse sequence is repeatedly operated, the magnitude of the phase-encoding gradient magnetic field (phase-encoding quantity) is sequentially varied every repetition, and the echoes of the number necessary to acquire one slice image are sequentially measured. At least tens m/sec is necessary as the time interval to repeat the pulse sequence in order to wait recovery of the magnetization. The image acquisition time per image is few seconds or longer since the number of echoes necessary to reconstruct one image is usually 256. Consequently, the gradient echo imaging is not suited for an image acquisition of an object having movements.

On the contrary, there is a retrospective gating for continuously acquiring images of an object having movement such as the heart. According to the method, a phase-encoding quantity (p) is fixed and a pulse sequence is repeated a predetermined number (S) of times with predetermined repetitive times (TR), thereby measuring (S) echoes. The (S) echoes measured are used to reconstruct images at different time phases. The measurement is repeated while sequentially varying the phase-encoding quantity and echoes necessary to reconstruct a plurality of images are measured. In case of measuring (N) echoes for one image, the pulse-encoding quantity (p) usually varies as $-N/2, \ldots, 0, \ldots, (N/2-1)$ In parallel with the measurement of the echoes, information of movement of the object is recorded. When an image is reconstructed, echoes are rearranged on the basis of the information. For example, when the heart is the object of image acquisition, echoes are rearranged by using an electrocardiogram recorded simultaneously with image acquisition. The relation between the electrocardiogram (ECG) and the phase-encoding quantity is, for example, as shown in FIG. 2. In the diagram, an example when S=8 is shown. In case of continuously acquiring images of (M) frames per heartbeat (M=5 in FIG. 2), in order to reconstruct an image at the (j)th time phase (j=1, ..., M), echoes measured at time phases nearest to the time phase (j) among echoes with the phase-encoding quantities (p) are collected with respect to all of the phase-encoding quantities (p). Table 1 shows the result when the echoes are rearranged according to the time phase and the phase-encoding quantity.

TABLE 1

| p | 1 | 2 | 3 |
|---|---|---|---|
| time phase 1 | 1, 6 | 3, 7 | — |
| time phase 2 | 2, 7 | 4, 8 | — |
| time phase 3 | 3, 8 | | 1, 2 |
| time phase 4 | 4 | 1, 5 | 3 |
| time phase 5 | 5 | 2, 6 | 4 |

Numbers in Table 1 are measurement numbers. For example, at the time phase 1, echoes of measurement numbers 1 and 6 are arranged in the phase-encoding quantity 1. The pair of echoes is subjected to a two-dimensional inverse Fourier transformation and an image of the heart at the time phase (j) can be consequently acquired. By reconstructing images with respect to all of the time phases (j), continuous images of the heart can be acquired. The details of the retrospective gating are described by Generald W. Lenz et al., "Retrospective Cardiac Gating: A Review of Technical Aspects and Future Directions" Magnetic Resonance Imaging, Vol. 7, pp. 445–455, 1989.

According to the retrospective gating, since the movement of the object of image acquisition is not always constant, omission of echo measurement sometimes occurs. For example, in the measurement shown in FIG. 2, an echo when p=2 at the time phase 3 is missing. Since the number (S) of echo measuring times is fixed with respect to each (p), the probability of omission occurrence of echo measurement is equal with respect to any phase encoding quantity.

However, an influence exerted on an image by the omission occurrence of echo measurement is not uniform with respect to (p) in which the omission of echo measurement occurs. The more the phase-encoding quantity is close to zero, the larger the power of the echo generally is. If the omission of echo measurement occurs when the phase-encoding quantity is close to zero, there is a problem that a large amount of an artifact occurs in an image.

SUMMARY OF THE INVENTION

The invention has been made in consideration of the above circumstances and it is an object to provide an inspection apparatus using magnetic resonance in which the above problem of the conventional technique is solved and occurrence of an artifact is minimized even when omission of echo measurement occurs.

The above object is achieved by an inspection apparatus using magnetic resonance comprising: means for generating a static magnetic field; means for applying a gradient magnetic field which applies a static magnetic field gradient; means for applying a high frequency magnetic field to an object to be inspected; and means for detecting an echo as a magnetic resonance signal from the object of inspection, wherein there is provided control means for controlling the means for applying the gradient magnetic field and the means for applying the high frequency magnetic field, and the control means has: a sequence for controlling the gradient magnetic field applying means and the high frequency magnetic field applying means to generate an echo, applying a phase-encoding gradient magnetic field quantity, and measuring the echo; and a step of storing a body movement signal outputted from body movement measuring means which measures movement of the object of inspection to memory means and performing the sequence a plurality of times with the same phase-encoding gradient magnetic field quantity while the sequence is performed, repeatedly performs the step while varying the phase-encoding gradient magnetic field quantity, and increases the number of execution times of the sequence in the step when an absolute value of the phase-encoding gradient magnetic field quantity is relatively small as compared to a case where an absolute value of the phase-encoding gradient magnetic field quantity is relatively large.

According to the invention, since the number of echo measuring times when the phase-encoding quantity is small is increased, the probability of omission occurrence of the echo measurement when the phase encoding quantity is small which exerts a large influence on an image is reduced. Thus, there is a remarkable effect that a slice image in which an artifact does not easily occur can be acquired.

BRIEF DESCRIPTION OF THE DRAWINGS

FIG. 7 is a diagram showing effects of the embodiment of the invention;

FIG. 8 are pictures showing reconstructed images and charts each showing the profile of corresponding phase-encoding for explaining effects of another embodiment;

DETAILED DESCRIPTION OF THE PREFERRED EMBODIMENTS

Figure 1:
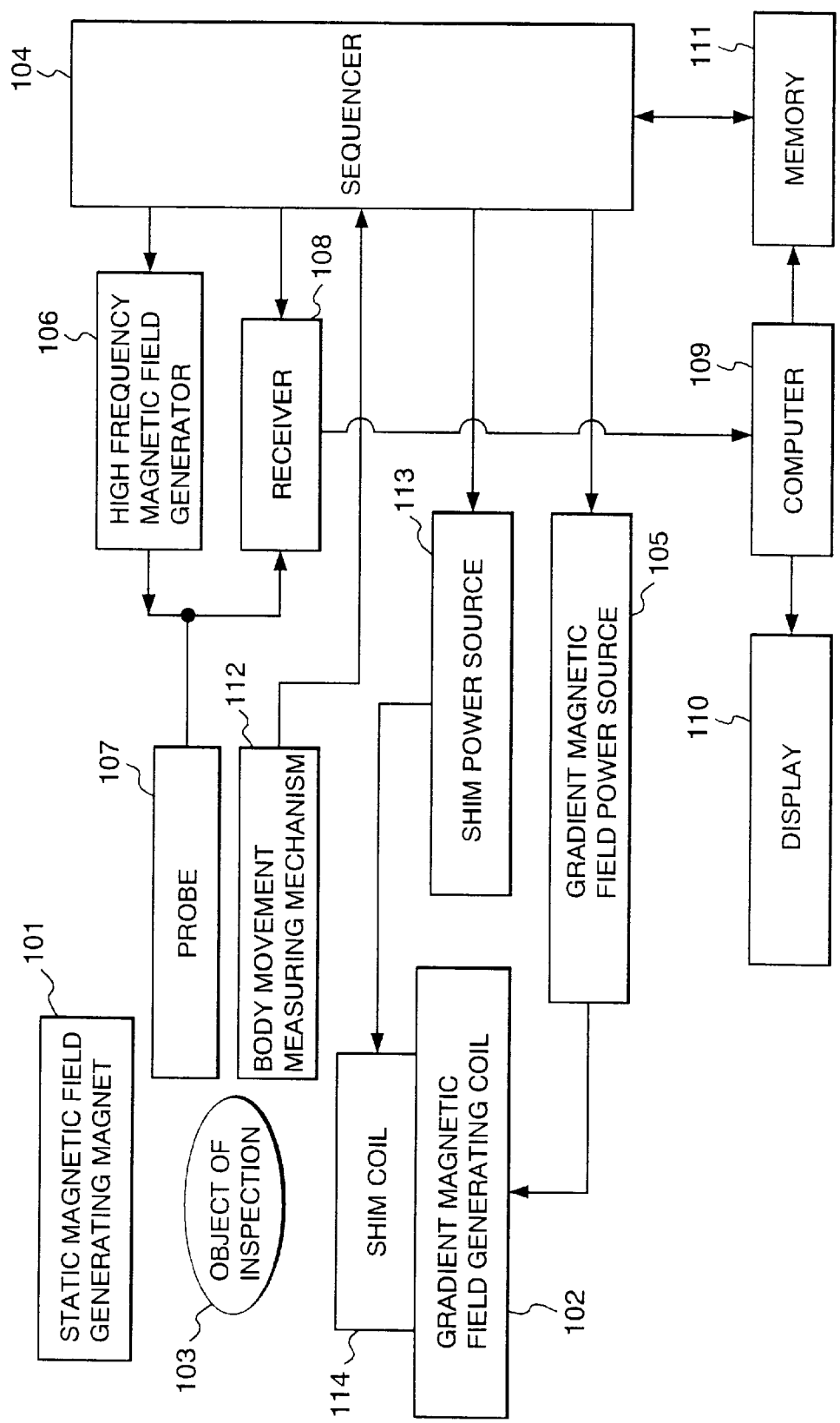
FIG. 1 is a diagram showing an inspection apparatus using magnetic resonance according to an embodiment of the invention.
Figure 2:
FIG. 2 is a diagram showing the measurement principles of conventional retrospective gating.

FIG. 1 shows the construction of an inspection apparatus using magnetic resonance (hereinbelow, simply called an inspection apparatus) according to an embodiment. In FIG. 1, reference numeral 101 denotes a magnet generating a static magnetic field; 102 a coil generating a gradient magnetic field; 103 an object of inspection which lies between the magnet 101 and the coil 102; and 104 a sequencer for sending commands to a gradient magnetic field power source 105 and a high frequency magnetic field generator 106 to generate a gradient magnetic field and a high frequency magnetic field. The high frequency magnetic field is applied to the object 103 of inspection through a probe 107. A signal generated from the object 103 of inspection is received by the probe 107 and is detected by a receiver 108. A magnetic resonance frequency as a reference of detection (hereinbelow, described as a detection reference frequency) is set by the sequencer 104 and the detection signal is sent to a computer 109 and a signal process such as image reconstruction or the like is performed. The result is displayed on a display 110. In accordance with necessity, the signal and a measurement condition can be stored in a memory 111. The sequencer 104 records an output signal from a body movement measuring mechanism 112 such as electrocardiograph, respiration monitor, or the like according to necessity. When it is necessary to adjust the evenness of static magnetic fields, a shim coil 114 is used. The shim coil 114 consists of a plurality of channels and a current is supplied from a shim power source 113. In the event of adjusting the evenness of the static magnetic fields, the current flowing in each coil is controlled by the sequencer 104. The sequencer 104 sends a command to the shim power source 113 and allows the shim coil 114 to generate an additional magnetic field so as to correct the unevenness of the static magnetic fields. Usually, the sequencer 104 controls so that devices operate at preliminary programmed timings and with powers. Among the programs, the one in which the high frequency magnetic field, the gradient magnetic field, and the timing and intensity of a reception signal are described is called a pulse sequence.

Figure 3:
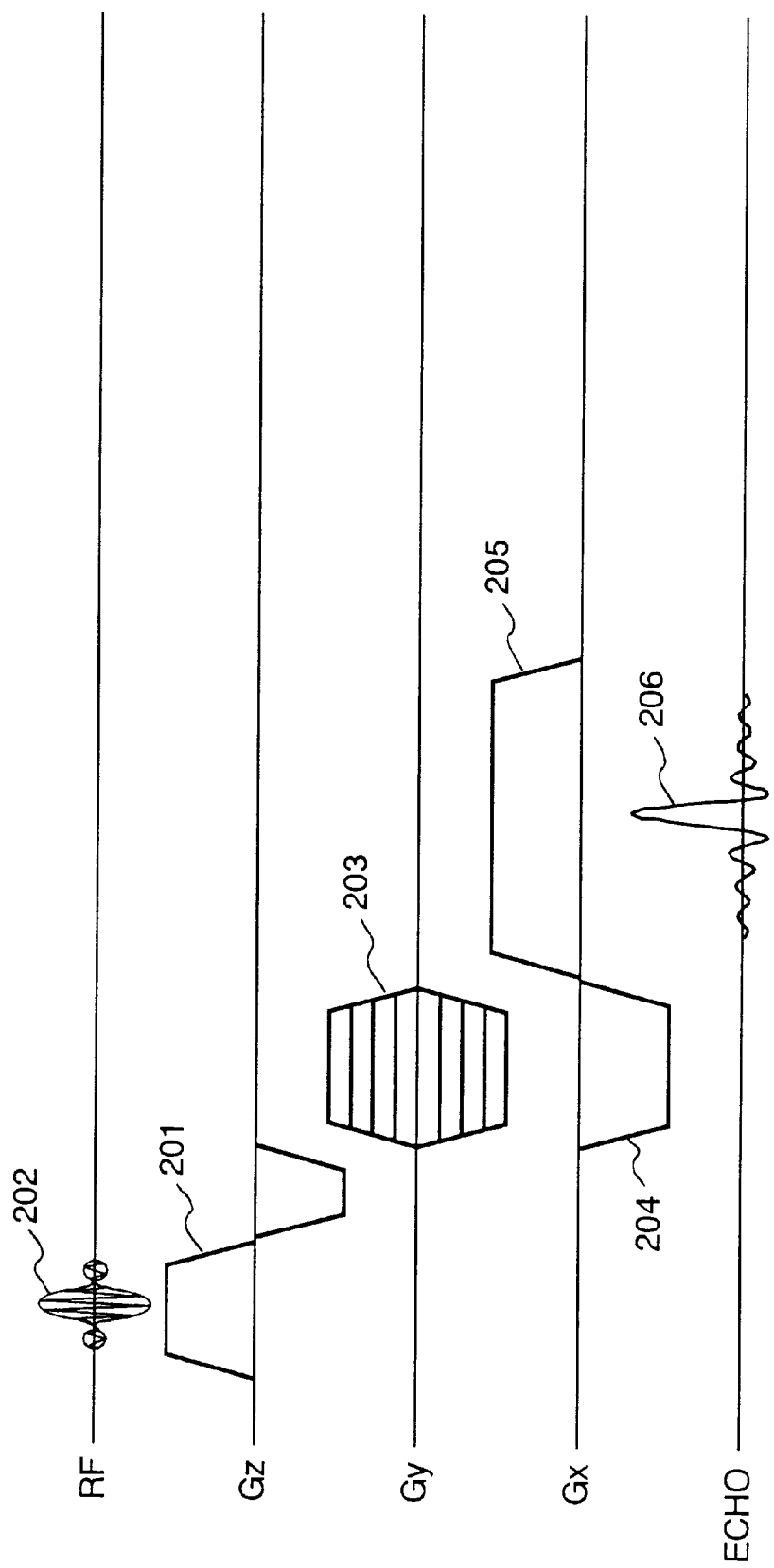
FIG. 3 is a diagram illustrating a pulse sequence.

An outline of an image acquiring procedure using the apparatus will be described by using a gradient echo technique as a typical pulse sequence shown in FIG. 3. An object of inspection is placed in the static magnetic fields, a high frequency magnetic field (RF) pulse 202 for magnetization excitation is applied as well as a slice gradient magnetic field 201 to bring about a magnetic resonance phenomenon in a slice of the object. A phase-encoding gradient magnetic field pulse 203 for adding position information in the phase encoding direction to the phase of magnetization is applied while applying readout gradient magnetic field pulses 204 and 205 for adding position information in the readout direction, and a magnetic resonance signal (echo) 206 is measured. The procedure is repeated with the repetition times TR and echoes necessary to acquire a plurality of images are measured. In this case, the magnitude of the phase-encoding gradient magnetic field pulse 203 is sequentially changed.

Figure 4:
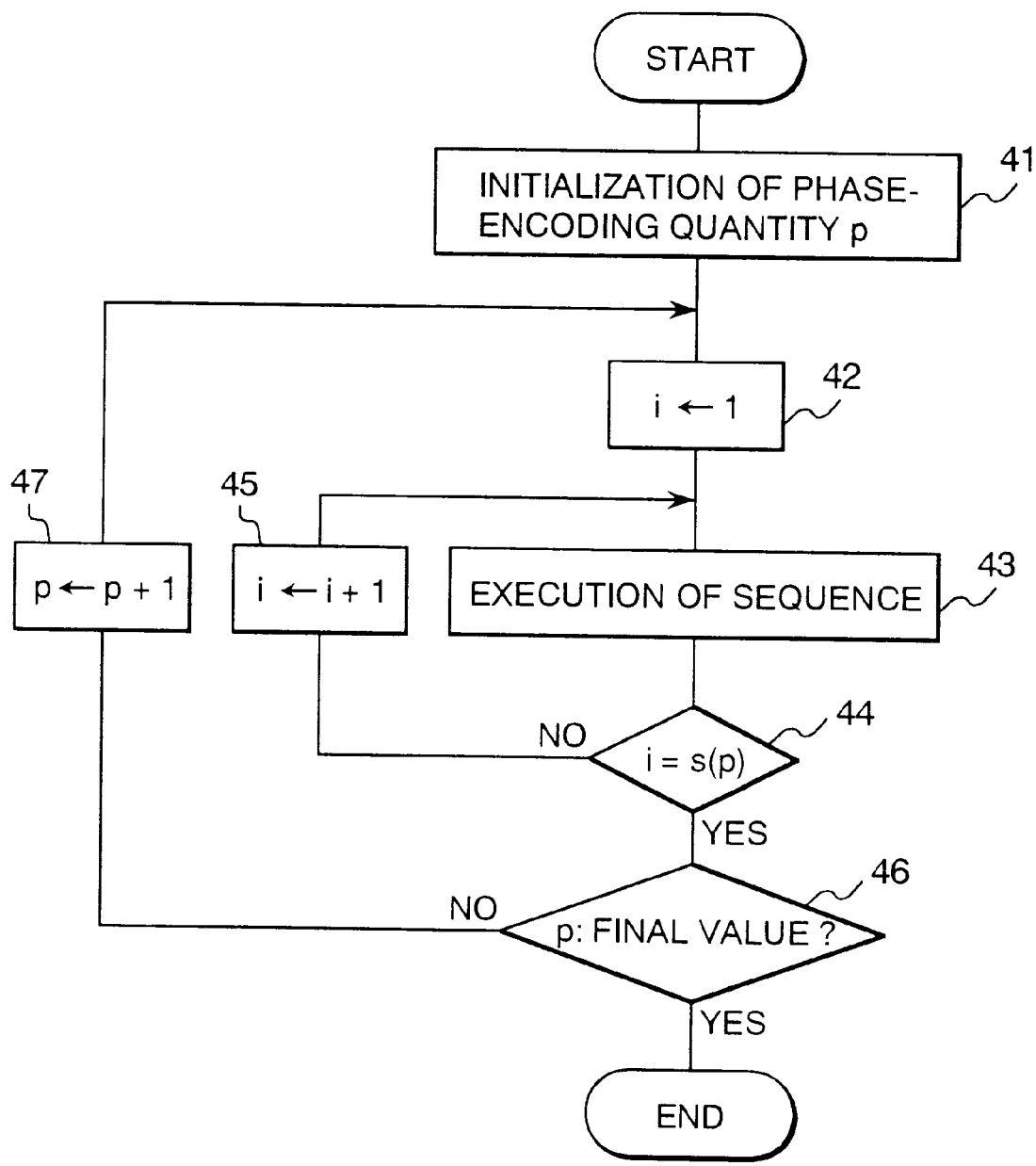
FIG. 4 is a flowchart showing processes according to the embodiment of the invention.

The measurement is controlled by a double loop due to different ways of varying the phase-encoding quantity. The flow of the measurement is shown in FIG. 4. First, a phase-encoding quantity (p) is set to an inial value (usually −N/2) (41), and a counter (i) is set to 1 (42). The value of (i) is increased by one each time the sequence is executed once (44) and the sequence is repeated until the number of execution times reaches a preliminary given number s(p) (44). While increasing the phase-encoding quantity one by one (47), the loop is repeated until the phase-encoding quantity (p) becomes a final value (usually N/2−1) (46), and the measurement is finished. Although the phase-encoding quantity is increased one by one in this case, this way of varying is arbitrary. The phase encoding quantity may be changed from the maximum value to the minimum value or may be changed in an arbitrary order. Although (p) is fixed and the measurement of s(p) times is continuously executed in this case, similar measurement effects can be also obtained when (p) is varied at random every measurement and the number of measurement times of each (p) is equal to s(p) at the end of measurement.

Figure 5:
FIG. 5 is a diagram showing the measurement principles according to the embodiment of the invention.

The body movement measuring mechanism 112 measures the movement of the object of inspection during the above measurement and sends signals to the computer 109. FIG. 5 shows an example of the relation between the body movement measured by the body movement measuring mechanism 112 and the phase-encoding quantity in a case where the body movement measuring mechanism is an electrocardiograph. In FIG. 5, the number (s) of measurement times is not fixed with respect to the phase-encoding quantity but is a function s(p) of (p). For example, the number (s) of measurement times is 10 when p=1, and s=8 when p=2.

Consequently, the probability of omission occurrence of echo measurement due to fluctuation in the period of body movement can be controlled for the phase encoding quantity (p). That is, in (p) when (s) is large, the probability of omission occurrence of echo measurement can be reduced. On the contrary, in (p) when (s) is small, the probability of omission occurrence of echo measurement can be increased.

Figure 6A:
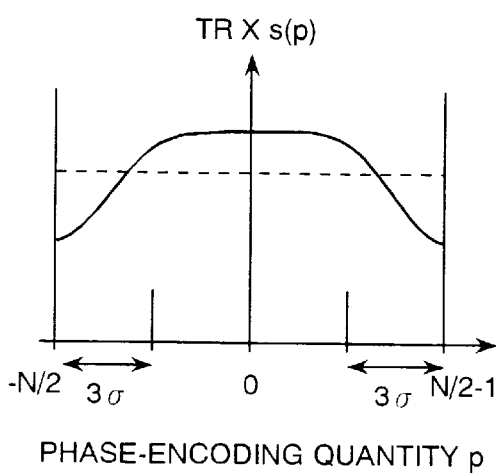
FIG. 6 is a diagram showing a phase-encoding quantity and the number of measurement times according to the embodiment of the invention.
Figure 6B:
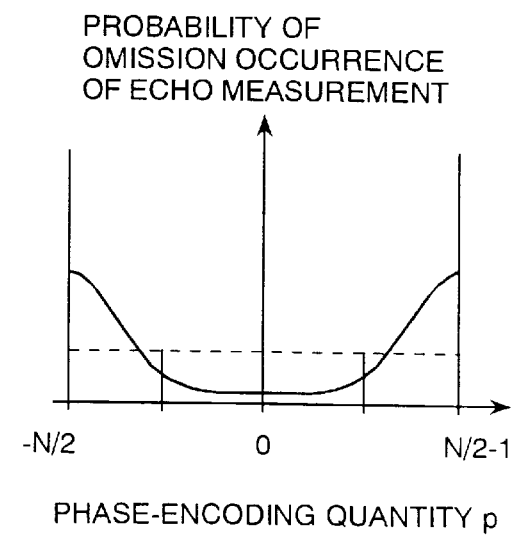

For example, as shown in FIG. 6(*a*), (TR×s) is set to be equal to the average period (T) of the body movement in the maximum phase encoding quantity and (TR×s) is set to a double value of (T) in a zero phase-encoding quantity. When a normal distribution ND (p, m, σ) of the means (m) and dispersion (σ) is used and the relation between (p) and (TR×s) is TR×s=2T−T×s×ND(p, N/2, N/4), the probability of omission occurrence of echo measurement is as shown in FIG. 6(*b*). Consequently, the probability of omission occurrence of echo measurement when the phase-encoding quantity is small can be reduced and occurrence of the artifact can be suppressed.

A state that the occurrence of artifact is suppressed by controlling the probability of omission occurrence of echo measurement will be described by using the result of computer simulation shown in FIG. 7. A circular model was Fourier transformed and raw data was obtained. The raw data was thinned out and the omission of echo measurement occurred. FIG. 7(*a*) shows a case of no omission of echo measurement, FIG. 7(*b*) shows a case where the probability of omission occurrence of echo measurement for (p) was fixed (shown by a broken line in FIG. 6), and FIG. 7(*c*) shows a case of using the distribution shown in FIG. 6. In each case, N=256 and the number of omission occurrence of each measurement was 32. In FIG. 7(*b*), since the measuring time twice as long as the body movement average period is used when the phase-encoding quantity is close to zero, it is considered that the omission of echo measurement hardly occurs, so that the probability of occurrence is set to zero. The left line shows raw data, the middle line shows reconstructed images, and the right line shows profiles in the phase-encoding direction in the center of the reconstructed image. The raw data and the reconstructed images are shown in model charts. It is understood from the diagram that when the probability of omission occurrence of echo measurement is fixed (b), a large artifact occurs in the image, however, in the case (c) according to the distribution of FIG. 6, the artifact hardly occurs and a picture quality almost equivalent to that of the case (a) of no omission occurrence of echo measurement can be obtained.

FIG. 8 shows a result of a similar simulation performed to an MRI diagnostic image of the heart of a human. The left line of pictures in FIG. 8 are reconstructed images and charts on the right side show profiles in the phase-encoding direction in the center of the reconstructed images on the left side. (a) shows a case where no omission of echo measurement occurs. (b) shows a case where the probability of omission occurrence of echo measurement for (p) is fixed (the case shown by the broken line in FIG. 6). (c) shows a result according to the distribution shown in FIG. 6. In each case, N=128 and the number of omission occurrence of echo measurement is 32. In (b), since a measurement time of twice as long as the body movement average period is used when the phase-encoding quantity is close to zero, it is considered that the omission of echo measurement hardly occurs, so that the probability of the occurrence is set to zero. It is understood from FIG. 8 that when the probability of omission occurrence of echo measurement is constant (b), a large artifact occurs in an image. In the case (b) according to the distribution of FIG. 6, the artifact hardly occurs and the picture quality which is almost equivalent to that of the case (a) where there is no omission of echo measurement can be obtained. Consequently, in an actual image as well, by controlling the probability of omission occurrence of echo measurement, the occurrence of artifact is suppressed.

In order to determine the number of measurement times in each phase-encoding quantity, an average period T of movement of the target of inspection has to be obtained. The obtaining method will be described as follows. An output waveform of the body movement measuring mechanism 112 is monitored by the computer 110 for a time which is few times to about ten times as long as a standard period and an average time between arbitrary two neighboring peaks of the waveform is obtained. The average time is (T) of body movement. In case of the heart, the monitoring time is few seconds to about 10 seconds since its standard period is 1 s. The measurement is performed to determine s(p) prior to the image acquiring procedure shown in FIG. 4. In case of simplifying the image acquisition, however, the procedure for obtaining the average period (T) may be omitted and a standard period of the object of inspection may be used as (T).

Figure 9A:
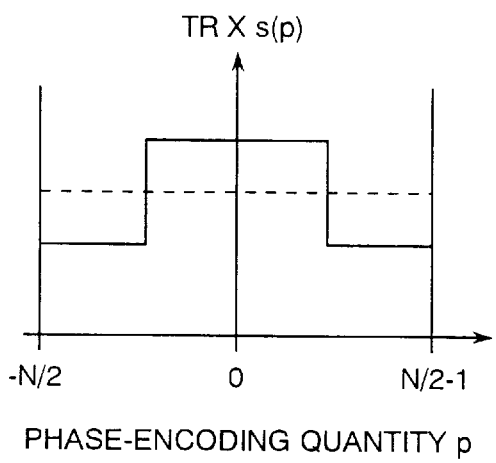
FIG. 9 is a diagram showing the phase-encoding quantity and the number of measurement times of another embodiment of the invention.
Figure 9B:
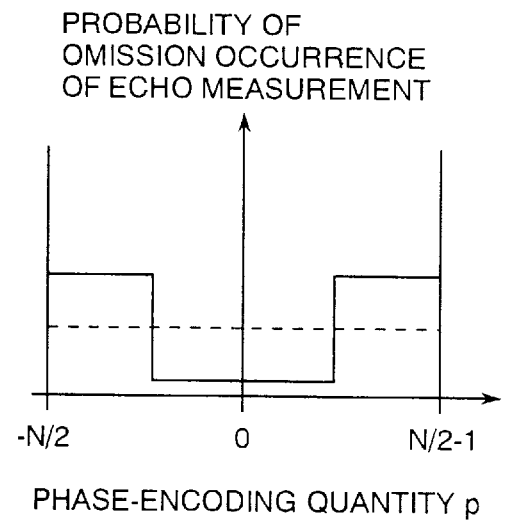

Similar effects can be also obtained with s(p) other than that shown in FIG. 6. For example, as shown in FIG. 9(*a*), when it is set so that (TR×s) is equal to the average period (T) of the body movement in the large phase-encoding quantity in the areas on both ends and (TR×s) is twice as large as (T) in the small phase-encoding quantity in the central area, the probability of omission occurrence of echo measurement when the phase-encoding quantity is small can be suppressed to almost zero as shown in FIG. 9(*b*). In a conventional method (shown by a broken line in the diagram) where (TR×s) is fixed for (p), the whole measurement time is equal to that when (TR×s)=1.5×T.

Figure 10A:
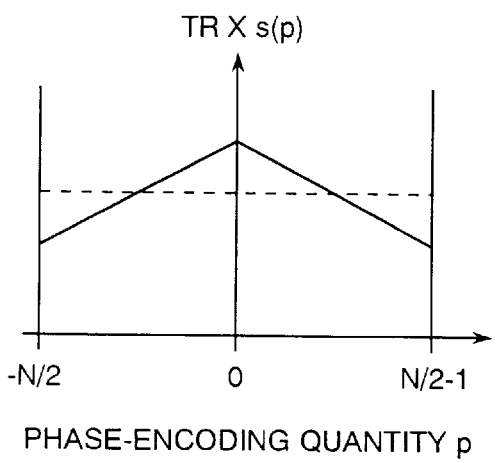
FIG. 10 is a diagram showing the phase-encoding quantity and the number of measurement times of another embodiment of the invention.
Figure 10B:
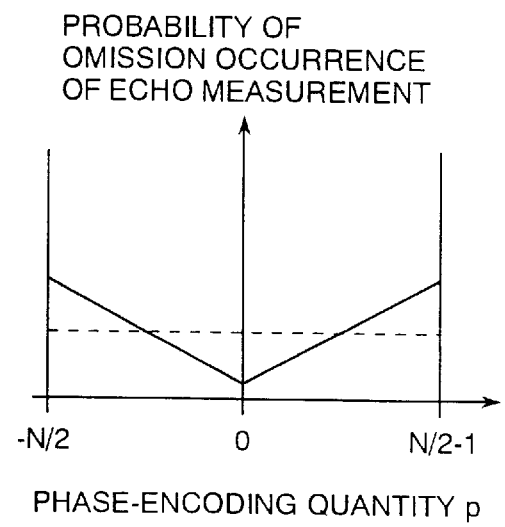

As shown in FIG. 10(*a*), it is set so that (TR×s) is equal to the average period (T) of body movement in the maximum phase-encoding quantity and (TR×s) is equal to a value twice as large as (T) in the zero phase-encoding quantity. s(p) may linearly vary in the phase encoding quantities between them. In this case, the probability of omission occurrence of echo measurement is as shown in FIG. 10(*b*). The whole measurement time is equal to that when (TR×s)=(1.5×T) in the conventional method (shown by the broken line) in which (TR×s) is fixed for (p).

Although the maximum value of (TR×s(p)) is 2T and the minimum value is (T) in the embodiment, the values can be properly adjusted in consideration of the whole image acquiring time and the picture quality. That is, when importance is placed on shortening of the image acquiring time, both of the values are reduced. When the picture quality is preferentially improved, the values are increased. Since the probability of omission occurrence of echo measurement generally increases when the image acquiring time is shortened, the picture quality deteriorates. When the picture quality has priority, the image acquiring time becomes longer. In an ordinary image acquisition, the average value of (TR×s(p)) should be larger than at least the average value of the body movement period. If the average value of (TR×s(p)) is smaller than the average value of the body movement period, the omission occurrence of echo measurement always occurs.

Although the case where the heart is the object of inspection has been described as an example in the embodiment, similar methods can be applied when the abdomen or the chest is the object of inspection. In such a case, a respiration monitor is used as the body movement measuring mechanism and an output waveform of the respiration monitor is used in place of the electrocardiogram. Further, when the object of inspection has a plurality of different movements, images are acquired by the above method in which the maximum value of the period of each movement is set to (T). For example, in a case where the heart is the object of inspection and images are acquired including the movement of the chest by respiration, since the respiration period is generally larger than the period of heart, the respiration period is set to (T).

Figure 11:
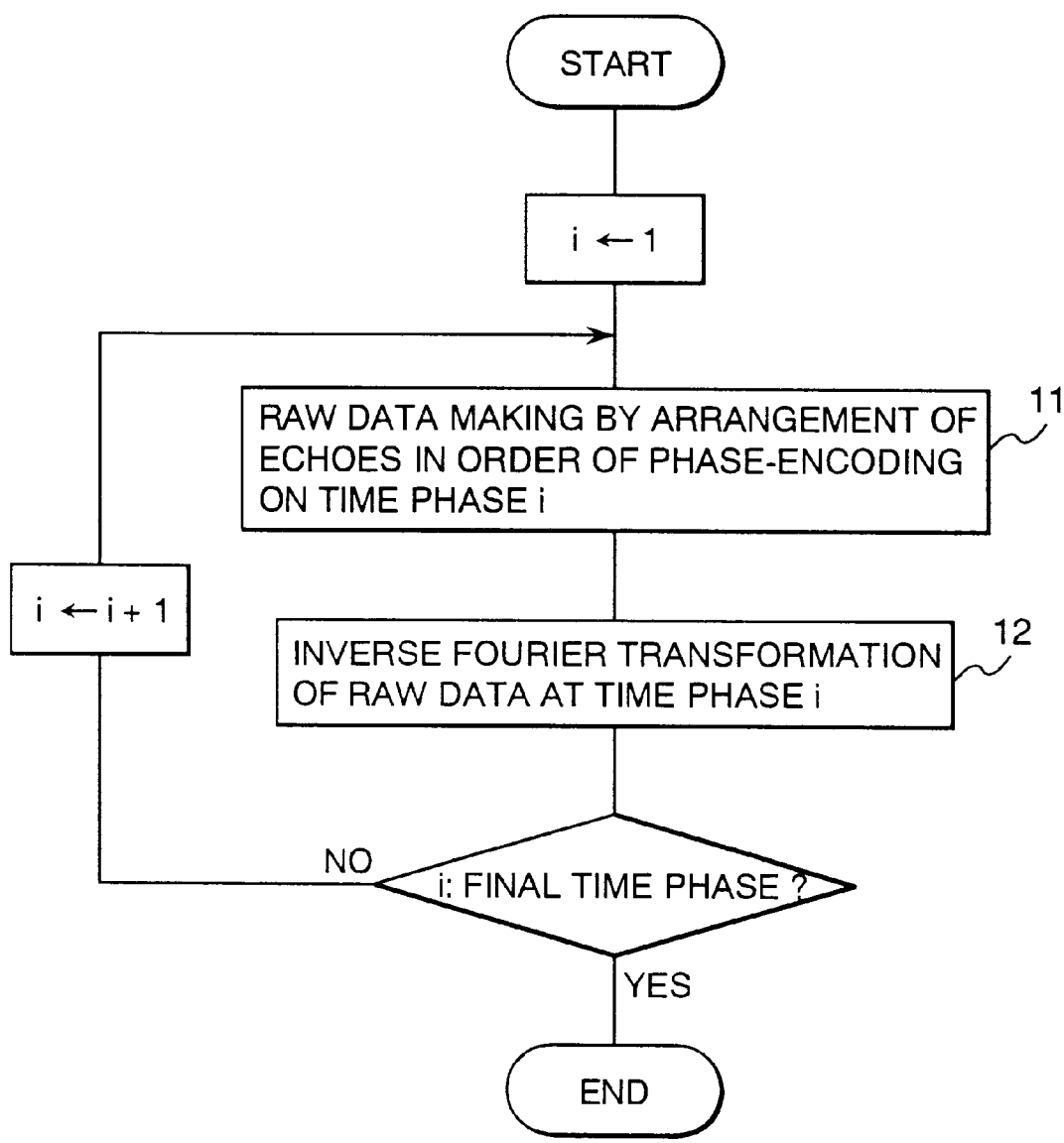
FIG. 11 is a flowchart showing an image reconstructing process of another embodiment of the invention.

A method of reconstructing an image from echoes measured by the above method will be described. The image reconstructing process is performed by the computer 110. As shown in FIG. 11, the process consists of a step (11) of rearranging echoes in accordance with the order of the phase-encoding quantity every time phase to thereby generate raw data and a step (12) of forming an image from the raw data by inverse Fourier transformation.

The process in the step (11) of rearranging the echoes will be described by using an example of the relation between the body movement and the phase-encoding quantity of FIG. 5. In the example, the electrocardiogram is used as a body movement monitor, one period of the heart is divided into five time phases, and five frames of moving images per one heart beat are intended to be formed. The number of measurement times for the phase-encoding quantity is s(1)=10, s(2)=8, . . . In this case, the result of rearrangement of the echoes in accordance with the time phase and the phase-encoding quantity is as shown in Table 2.

TABLE 2

| p | 1 | 2 | 3 |
|---|---|---|---|
| time phase 1 | 1, 6 | 1, 5 | — |
| time phase 2 | 2, 7 | 2, 6 | — |
| time phase 3 | 3, 8 | 7, 8 | — |
| time phase 4 | 4, 9 | 3 | 1 |
| time phase 5 | 5, 10 | 4 | 2 |

Numbers in the table are measurement numbers. For example, at the time phase 1, echoes having the measurement Nos. of 1 and 6 are arranged in the phase-encoding quantity 1. In step 12, the raw data is inverse Fourier transformed, thereby forming an image at a time phase (i). Usually, fast Fourier transformation is used. When the process is performed with respect to all of the five time phases, five frames per heartbeat of moving images of the heart can be obtained.

In Table 2, there are cases that a plurality of echoes are arranged in the same phase-encoding quantity at the same time phase. In this case, by averaging the echoes, the S/N ratio of the echo can be improved and the S/N ratio of the image can be consequently improved.

Omission of an echo may occur due to fluctuation of the body movement. The probability of the omission occurrence is high in the large phase-encoding quantity where s(p) is suppressed. In this case, the omitted echo is compensated by another echo, thereby enabling an image with a higher picture quality to be obtained. For example, an omitted echo can be compensated by an echo in the same phase-encoding quantity at a different time phase. In this case, it is better to use the echo at a close time phase. When no echoes in the same phase-encoding quantity exist, an echo in a close phase-encoding quantity can be used instead. As another method of compensating the omitted echo, the omitted echo can be compensated by an echo formed by an interpolating process such as a linear interpolation by using an echo of the same or near phase-encoding quantity at the same or near time phase.

What is claimed is:

1. An inspection apparatus using magnetic resonance comprising: means for generating a static magnetic field; means for applying a gradient magnetic field which applies a static magnetic field gradient; means for applying a high frequency magnetic field to an object to be inspected; and means for detecting an echo as a magnetic resonance signal from the object of inspection, wherein there is provided control means for controlling the means for applying the gradient magnetic field and the means for applying the high frequency magnetic field, and the control means has a sequence for controlling the gradient magnetic field applying means and the high frequency magnetic field applying means to generate an echo, applying a phase-encoding gradient magnetic field quantity, and measuring the echo and has a step of storing a body movement signal outputted from body movement measuring means which measures movement of the object of inspection to memory means and performing the sequence a plurality of times with the same phase-encoding gradient magnetic field quantity while the sequence is performed, repeatedly performs the step while varying the phase-encoding gradient magnetic field quantity, and increases the number of execution times of the sequence in the step when an absolute value of the phase-encoding gradient magnetic field quantity is small as compared to a case where an absolute value of the phase-encoding gradient magnetic field quantity is large.

2. The apparatus according to claim 1, wherein the body movement measuring means measures an average period of the movement of the object of inspection prior to the execution of the sequence.

3. The apparatus according to claim 1 or 2, wherein the number of execution times of the sequence in the step performed while varying the phase-encoding gradient magnetic field quantity is a constant number of times in areas of both ends of the axis of abscissa where the absolute value of the phase-encoding gradient magnetic field quantity is large and is a constant number which is larger than the foregoing constant number in the central area.

4. The apparatus according to claim 1 or 2, wherein the number of execution times of the sequence in the step executed while varying the phase-encoding gradient magnetic field quantity changes in inverse proportion to the magnitude of the absolute value of the phase-encoding gradient magnetic field quantity.

5. The apparatus according to claim 2, wherein total time of the execution of the sequence in the step is not shorter than the average period for a small phase-encoding gradient magnetic field quantity.

6. The apparatus according to claim 2, wherein an average value of the total time of the execution of the sequence in the step is equal to or larger than the average period.

7. The apparatus according to claim 1, wherein the body movement measuring means is an electro-cardiograph.

8. The apparatus according to claim 1, wherein the body movement measuring means is a respiration monitor.

9. The apparatus according to claim 1, further comprising image reconstructing means for reconstructing an image from detected echoes, wherein the image reconstructing means rearranges the detected echoes in accordance with the order of the phase-encoding gradient magnetic field quantities every time phase of the body movement measured by the body movement measuring means.

10. The apparatus according to claim 9, wherein the image reconstructing means multiplies echoes in the same phase-encoding gradient magnetic field quantity at the same time phase.

11. The apparatus according to claim 10, wherein the image reconstructing means compensates a phase-encoding gradient magnetic field quantity in which an echo is missing by an echo of the same or close phase encoding gradient magnetic field quantity at other time phase.

12. The apparatus according to claim 10, wherein the image reconstructing means compensates a phase-encoding gradient magnetic field quantity in which an echo is missing by an echo formed by an interpolating process using an echo of a close phase-encoding gradient magnetic field quantity.

* * * * *

UNITED STATES PATENT AND TRADEMARK OFFICE
CERTIFICATE OF CORRECTION

PATENT NO.   : 6,043,650
DATED        : March 28, 2000
INVENTOR(S)  : Yo Taniguchi, et al.

It is certified that error appears in the above-identified patent and that said Letters Patent is hereby corrected as shown below:

<u>Title page,</u>
Item 73 Assignee replace "Hitachi, Ltd., Tokyo, Japan" with -- Hitachi, Ltd. and Hitachi Medical Corporation, Tokyo, Japan --.

Signed and Sealed this

Twenty-first Day of August, 2001

Attest:

*Nicholas P. Godici*

NICHOLAS P. GODICI
*Attesting Officer*   *Acting Director of the United States Patent and Trademark Office*